(12) United States Patent
Lee et al.

(10) Patent No.: US 11,202,372 B2
(45) Date of Patent: Dec. 14, 2021

(54) APPARATUS FOR PERFORMING COMPENSATION ASSOCIATED WITH SCREEN PRINTER AND METHOD THEREOF

(71) Applicant: KOH YOUNG TECHNOLOGY INC., Seoul (KR)

(72) Inventors: Duk Young Lee, Suwon-si (KR); Jae Hyung Kim, Seongnam-si (KR); Jeong Kyu Noh, Seoul (KR)

(73) Assignee: KOH YOUNG TECHNOLOGY INC., Seoul (KR)

( * ) Notice: Subject to any disclaimer, the term of this patent is extended or adjusted under 35 U.S.C. 154(b) by 42 days.

(21) Appl. No.: 16/229,453

(22) Filed: Dec. 21, 2018

(65) Prior Publication Data

US 2019/0364666 A1   Nov. 28, 2019

(30) Foreign Application Priority Data

May 25, 2018   (KR) .................... 10-2018-0059704
Nov. 26, 2018   (KR) .................... 10-2018-0147798

(51) Int. Cl.
*H05K 3/12*   (2006.01)
*B41F 15/34*   (2006.01)
(Continued)

(52) U.S. Cl.
CPC .......... *H05K 3/1225* (2013.01); *B41F 15/34* (2013.01); *H05K 3/3485* (2020.08); *B41F 15/08* (2013.01)

(58) Field of Classification Search
None
See application file for complete search history.

(56) References Cited

U.S. PATENT DOCUMENTS 4,783,826 A * 11/1988 Koso ................ G01N 21/95607
                                                          348/130
5,740,729 A *  4/1998 Hikita .................... B41F 15/12
                                                          101/126
(Continued)

FOREIGN PATENT DOCUMENTS

CN         1907706        2/2007
CN       101379897        3/2009
(Continued)

OTHER PUBLICATIONS

Korean Office Action, with English translation, corresponding to Korean Application No. 10-2018-0147798, dated Feb. 7, 2020.
(Continued)

*Primary Examiner* — Jill E Culler
(74) *Attorney, Agent, or Firm* — Kile Park Reed & Houtteman PLLC (57) ABSTRACT

An apparatus that communicates with a screen printer and a solder inspection device is disclosed. The apparatus according to the present disclosure may include a process that is configured to: obtain first information associated with each of a plurality of pads on the substrate; obtain second information associated with each piece of the solder paste applied to each of the plurality of pads from the solder inspection device; determine a position correction value for the stencil mask with respect to the substrate based on the first information and the second information; and deliver the position correction value to the screen printer.

9 Claims, 5 Drawing Sheets

(51) Int. Cl.
*H05K 3/34* (2006.01)
*B41F 15/08* (2006.01)

(56) References Cited

U.S. PATENT DOCUMENTS

| 5,912,984 | A | | 6/1999 | Michael et al. |
| 6,011,629 | A | * | 1/2000 | Ootake ................ H05K 3/1216 |
| | | | | 356/400 |
| 9,661,755 | B2 | * | 5/2017 | Cherbis ................ H05K 3/1233 |
| 2009/0014501 | A1 | | 1/2009 | Nishi et al. |
| 2015/0210064 | A1 | | 7/2015 | Kim et al. |
| 2017/0367229 | A1 | | 12/2017 | Kim |

FOREIGN PATENT DOCUMENTS

| CN | 107079618 | 8/2017 |
| EP | 3 223 594 | 9/2017 |
| JP | 2013-211284 | 10/2013 |
| KR | 10-1491037 | 2/2015 |

OTHER PUBLICATIONS

European Search Report corresponding to European Application No. 18215530.9, dated Jul. 18, 2019.

Chinese Office Action, with English translation, corresponding to Chinese Application No. or Publication No. 201811582123.5, dated Oct. 10, 2020.

Chinese Office Action, with English translation, corresponding to Chinese Application No. or Publication No. 201811582123.5, dated May 25, 2021.

European Office Action, corresponding to European Application No. 18 215 530.9, dated Apr. 7, 2021.

* cited by examiner

APPARATUS FOR PERFORMING COMPENSATION ASSOCIATED WITH SCREEN PRINTER AND METHOD THEREOF

CROSS-REFERENCE TO RELATED APPLICATIONS

This application is based upon and claims the benefit of priority from Korean Patent Application No. 10-2018-0059704, filed on May 25, 2018, and Korean Patent Application No. 10-2018-0147798, filed on Nov. 26, 2018, the entire contents of which are incorporated herein by reference.

TECHNICAL FIELD

The present disclosure relates to a method and apparatus for performing compensation associated with a screen printer.

The present disclosure is derived from research conducted as part of the Robot Industry Fusion Core Technology Development Project of the Ministry of Trade, Industry, and Energy.

[Project identification number: 10077589; Title of research project: Development of Technology for a Machine-Learning-Based SMT Optimization System]

BACKGROUND

Before components are mounted on a substrate (e.g., a printed circuit board), a screen printer may apply solder paste on pads of the substrate. Subsequently, a solder paste inspection (SPI) equipment may inspect the state of application of the applied solder paste. After the inspection is performed, the components may be mounted using surface-mount technology (SMT) on the pads of the printed circuit board to which the solder paste is applied.

A stencil mask may be disposed on the substrate when solder paste is applied to the substrate. The stencil mask may be a board in which openings are formed in areas corresponding to the positions of the pads on the substrate. When the screen printer applies solder paste to the substrate on which the stencil mask is disposed, the solder paste may be applied on the pads of the substrate. However, if an error occurs while the stencil mask is produced or while the stencil mask is disposed on the substrate (a disposition error), the solder paste may be applied at a region other than a region where a pad is disposed. If the solder paste is applied to an incorrect region, the components may be improperly mounted, which results in production of a defective substrate.

On the basis of the position of a pad of the substrate and the position of applied solder paste, a position correction value for the stencil mask with respect to the substrate may be determined, whereby the incidence of errors occurring when solder paste is applied may be reduced. However, the shape and size is different for each of the plurality of pads on the substrate. Accordingly, if the position correction value is incorrectly calculated, solder paste to be applied to a predetermined pad may be applied to a region that is even more distant from the pad than before conducting the compensation.

SUMMARY

The present disclosure is to solve the above-described problems, and provides a technology that determines the most appropriate position correction value for a stencil mask with respect to a substrate.

According to one embodiment of the present disclosure, there is provided an apparatus for performing compensation associated with a screen printer. The apparatus according to one embodiment of the present disclosure may communicate with a screen printer that applies solder paste to a substrate on which a stencil mask is disposed, and may communicate with a solder inspection device that measures the state of the solder paste applied to the substrate. The apparatus may include a processor that is configured to: obtain first information associated with each of a plurality of pads on the substrate; obtain second information associated with each piece of the solder paste applied to each of the plurality of pads from the solder inspection device; determine a position correction value for the stencil mask with respect to the substrate based on the first information and the second information; and deliver the position correction value to the screen printer.

According to an embodiment, the processor may determine a plurality of first regions on the substrate based on the first information, each of the plurality of first regions corresponding to each of the plurality of pads; determine a plurality of second regions on the substrate based on the second information, each of the plurality of second regions corresponding to each piece of the solder paste applied to each of the plurality of pads; determine a plurality of cross regions in which the plurality of first regions and the plurality of second regions overlap each other; determine a first cross area ratio of an entire area of the plurality of cross regions to an entire area of the plurality of first regions; and determine the position correction value that maximizes the first cross area ratio.

According to an embodiment, the processor may determine a second cross area ratio for each of the plurality of pads, the second cross area ratio being a ratio of an area of one of the plurality of cross regions to an area of one of the plurality of first regions; determine a pad that has the smallest second cross area ratio among the plurality of pads; and determine the position correction value that maximizes the second cross area ratio of the determined pad.

According to an embodiment, the apparatus may further include a memory storing the first information.

According to an embodiment, the apparatus may further include a communication interface electrically connected to the processor and controlled by the processor to deliver the position correction value to the screen printer. According to an embodiment, the apparatus may be disposed inside the solder inspection device.

According to an embodiment, the processor may determine one or more pads having second cross area ratios that are smaller than a predetermined reference ratio among the plurality of pads; and determine the position correction value that maximizes the second cross area ratios of the determined one or more pads.

According to an embodiment, the processor may determine one or more pads having first regions that are smaller than a predetermined reference size among the plurality of pads, based on the first information; and determine the position correction value that maximizes the second cross area ratios of the determined one or more pads.

According to an embodiment, the processor may determine the position correction value by applying a weight to an amount of change of the second cross area ratios of the determined one or more pads which changes as a position of the stencil mask is corrected.

According to an embodiment, the processor may repeatedly determine the position correction value a number of times; and deliver, to the screen printer, at least one selected from a mean value, a median value and a mode value of a plurality of determined position correction values.

According to an embodiment, the processor may determine a solder-printing pressure correction value and a solder-printing speed correction value for the screen printer based on the first information, the second information and the position correction value; and deliver the solder-printing pressure correction value and the solder-printing speed correction value to the screen printer.

According to an embodiment, the position correction value includes a position correction value for a direction of a first axis, a position correction value for a direction of a second axis, and an amount of rotation for the stencil mask with respect to the substrate, the second axis being perpendicular to the first axis.

According to one embodiment of the present disclosure, there is provided a method of performing compensation associated with a screen printer. A method according to the one embodiment of the present disclosure, which may be performed by the above-described apparatus, may include: obtaining first information associated with each of a plurality of pads on a substrate; obtaining second information associated with each piece of solder paste applied to the each of the plurality of pads, from a solder inspection device that measures a state of the solder paste; determining a position correction value for a stencil mask with respect to the substrate on which the stencil mask is disposed, based on the first information and the second information; and delivering the position correction value to a screen printer that applies the solder paste.

According to an embodiment, the determining the position correction value may include: determining a plurality of first regions on the substrate based on the first information, each of the plurality of first regions corresponding to each of the plurality of pads; determining a plurality of second regions on the substrate based on the second information, each of the plurality of second regions corresponding to each piece of the solder paste applied to each of the plurality of pads; determining a plurality of cross regions in which the plurality of first regions and the plurality of second regions overlap each other; determining a first cross area ratio of an entire area of the plurality of cross regions to an entire area of the plurality of first regions; and determining the position correction value that maximizes the first cross area ratio.

According to an embodiment, the determining the position correction value may further include: determining a second cross area ratio for each of the plurality of pads, the second cross area ratio being a ratio of an area of one of the plurality of cross regions to an area of one of the plurality of first regions; determining a pad that has the smallest second cross area ratio among the plurality of pads; and determining the position correction value that maximizes the second cross area ratio of the determined pad.

According to an embodiment, the determining the position correction value may further include: determining one or more pads having second cross area ratios that are smaller than a predetermined reference ratio among the plurality of pads; and determining the position correction value that maximizes the second cross area ratios of the determined one or more pads.

According to an embodiment, the determining the position correction value may further include: determining one or more pads having first regions that are smaller than a predetermined reference size among the plurality of pads, based on the first information; and determining the position correction value that maximizes the second cross area ratios of the determined one or more pads.

According to an embodiment, the determining the position correction value may further include: determining the position correction value by applying a weight to an amount of change of the second cross area ratios of the determined one or more pads which changes as a position of the stencil mask is corrected.

According to an embodiment, the method for performing compensation associated with the screen printer may further include: repeatedly determining the position correction value a number of times; and delivering, to the screen printer, at least one selected from a mean value, a median value and a mode value of a plurality of determined position correction values.

According to an embodiment, the method for performing compensation associated with the screen printer may further include: determining a solder-printing pressure correction value and a solder-printing speed correction value for the screen printer based on the first information, the second information and the position correction value; and delivering the solder-printing pressure correction value and the solder-printing speed correction value to the screen printer.

According to an embodiment, the position correction value includes a position correction value for a direction of a first axis, a position correction value for a direction of a second axis, and an amount of rotation for the stencil mask with respect to the substrate, the second axis being perpendicular to the first axis.

According to an embodiment, the delivering the position correction value to the screen printer may include: delivering the position correction value to the screen printer via a communication interface of the apparatus. According to an embodiment, the apparatus may be disposed inside the solder inspection device.

According to one embodiment of the present disclosure, there is provided a non-transitory computer-readable recording medium storing a program to be executed on a computer. The recording medium according to the one embodiment of the present disclosure may store the program, wherein the program may include commands that, when executed by a processor, causes the processor to perform: obtaining first information associated with each of a plurality of pads on a substrate; obtaining second information associated with each piece of solder paste applied to each of the plurality of pads, from a solder inspection device that measures a state of the solder paste; determining a position correction value for a stencil mask with respect to the substrate on which the stencil mask is disposed, based on the first information and the second information; and delivering the position correction value to a screen printer that applies the solder paste.

According to an embodiment, the determining the position correction value may include: determining a plurality of first regions on the substrate based on the first information, each of the plurality of first regions corresponding to each of the plurality of pads; determining a plurality of second regions on the substrate based on the second information, each of the plurality of second regions corresponding to each piece of the solder paste applied to each of the plurality of pads; determining a plurality of cross regions in which the plurality of first regions and the plurality of second regions overlap each other; determining a first cross area ratio of an entire area of the plurality of cross regions to an entire area of the plurality of first regions; and determining the position correction value that maximizes the first cross area ratio.

According to various embodiments of the present disclosure, the reliability of operation of a screen printer that applies solder paste may be improved.

According to various embodiments of the present disclosure, the most appropriate position correction value for a stencil mask may be determined in order to decrease an error rate of a substrate-manufacturing process.

BRIEF DESCRIPTION OF DRAWINGS

The above and other aspects, features and advantages of the present disclosure will be more apparent from the following detailed description taken in conjunction with the accompanying drawings, in which.

DETAILED DESCRIPTION

Various embodiments in the present disclosure are illustrated for the purpose of accurate description of the technical idea of the present disclosure, and should not be construed to be limited to a predetermined embodiment. The technical idea of the present disclosure may include various modifications, equivalents, and alternatives to the embodiments provided in the present disclosure, and may include a combination of some or all selected from each of the embodiments. Also, the scope of right of the technical idea of the present disclosure is not limited to the various embodiments provided below or to the detailed descriptions thereof.

The terms used in the present disclosure, including technical or scientific terms, have meanings that are generally understood by those skilled in the art that the present disclosure belongs to, unless otherwise defined.

Expressions such as "comprise", "may comprise", "include", "may include", "have", "may have", and the like, used in the present disclosure, indicate that a feature (e.g., a function, an operation, an element, or the like), which is the object of the expression, exists, and do not exclude other additional features. That is, the expressions should be understood as open-ended terms including the possibility that other elements may also exist.

In the present disclosure, an expression in the singular form may include the meaning of the plural form, unless otherwise specified, and this will be equally applied to an expression in the singular form included in the claims.

Expressions such as "1st", "2nd", "first", "second", and the like, used in the present disclosure, are used to distinguish one object from another object when designating a plurality of objects of the same kind, unless otherwise specified, and the expressions may not define the order of the objects or the importance of the objects.

Expressions such as "A, B, and C", "A, B, or C", "A, B, and/or C", "at least one of A, B, and C", "at least one of A, B, or C", "at least one of A, B, and/or C", and the like indicate listed items or all possible combinations of listed items. For example, "at least one of A or B" indicates (1) at least one A, (2) at least one B, or (3) at least one A and at least one B.

The expression "based on" used in the present disclosure is used to describe one or more factors that affect determination, an operation of making a decision, or an operation described in a phrase or a sentence including the corresponding expression, and the expression does not exclude additional factors that affect the corresponding determination, the operation of making a decision, or the other operation.

In the present disclosure, the expression "an element (e.g., a first element) is connected to or accesses another element (e.g., a second element)" may indicate that the element is directly connected to or accesses the other element, or may indicate that the element is connected to or accesses the other element using a new element (e.g., a third element) as a medium therebetween.

The expression "configured to" used in the present disclosure may include meanings such as "set to", "has an ability to", "changed so as to", "made to", "able to", and the like, depending on the context. The expression is not limited to "designed specially in terms of hardware". For example, a processor configured to perform a predetermined operation may be a general-purpose processor that is capable of performing the predetermined operation by executing software.

To describe various embodiments of the present disclosure, an orthogonal coordinate system may be defined, the system including the X-axis, the Y-axis, and the Z-axis, which are orthogonal to each other. Expressions used in the present disclosure in association with the orthogonal coordinate system, such as "X-axial direction", "Y-axial direction", "Z-axial direction", and the like, may indicate both directions in which each axis in the orthogonal coordinate system extends, unless otherwise specified. Also, the "+" sign put in front of the direction of each axis indicates the positive direction, which is one of the directions in which the corresponding axis extends. The "−" sign put in front of the direction of each axis indicates the negative direction, which is the other of the directions in which the corresponding axis extends.

In the present disclosure, a substrate is a board or a container in which elements such as a semiconductor chip and the like are mounted, and the substrate may act as a passageway of electric signals among the elements. The substrate may be used to manufacture an integrated circuit or the like, and may be formed of a material such as silicone or the like. For example, the substrate may be a printed circuit board (PCB), and may be referred to as a wafer or the like depending on the embodiment.

Hereinafter, various embodiments of the present disclosure will be described with reference to attached drawings. In the drawings and descriptions of the drawings, the same or substantially equivalent elements may be assigned the same reference numerals. Also, in various embodiments described below, overlapping descriptions of the same elements or corresponding elements may be omitted. However, this does not mean that an element for which a description is omitted is not included in the corresponding embodiment.

Figure 1:
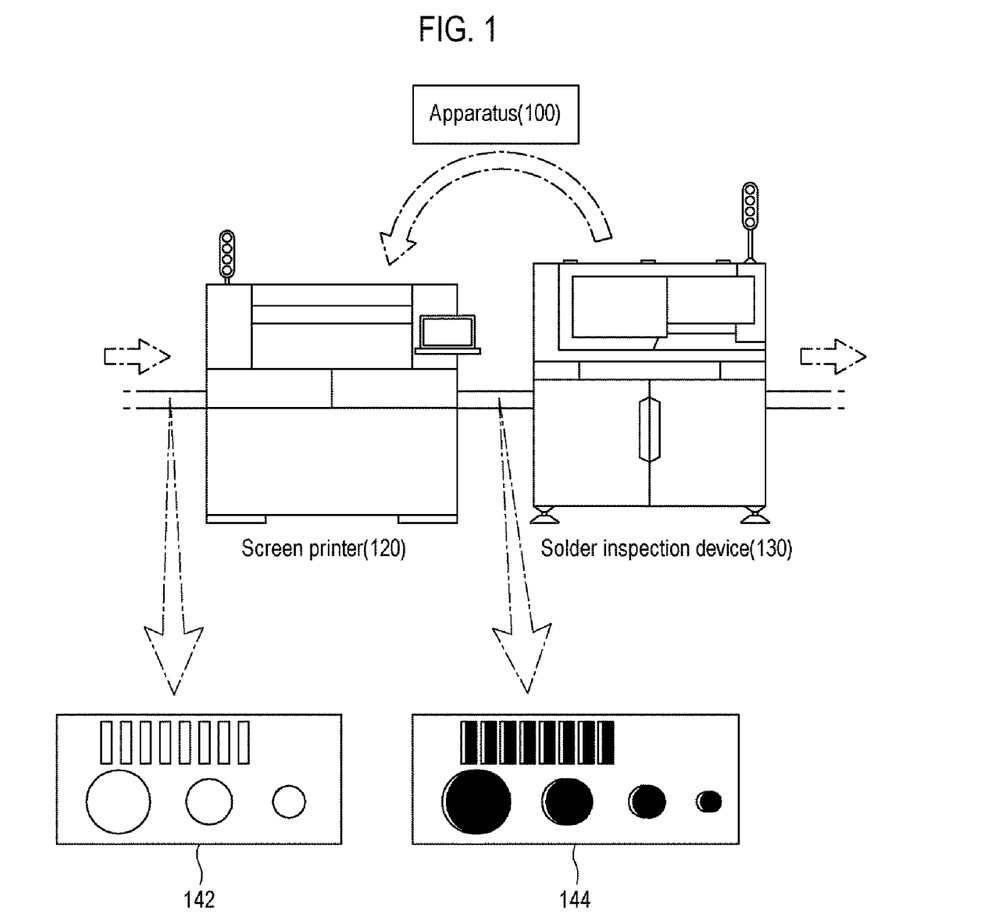
FIG. 1 illustrates an embodiment of a process that an apparatus for performing compensation associated with a screen printer performs according to the present disclosure.

FIG. 1 illustrates an embodiment of a process that an apparatus for performing compensation associated with a screen printer performs according to the present disclosure. An apparatus for performing compensation associated with a screen printer according to the present disclosure may be implemented as an apparatus 100 according to various embodiments. The apparatus 100 according to various embodiments of the present disclosure may determine a position correction value for a stencil mask based on a state of solder paste applied to a substrate, and deliver the position correction value to a screen printer 120 so as to correct the disposition of the stencil mask. According to an embodiment, the apparatus 100 may be implemented as a separate device, or may be implemented in a solder inspection device 130. When the apparatus 100 is implemented in the solder inspection device 130, the apparatus 100 according to an embodiment may directly communicate with the solder inspection device 130 without using a communication interface, which will be described later.

In a substrate-manufacturing process, a substrate 142 may be delivered to the screen printer 120. A stencil mask may be disposed on the substrate 142. The screen printer 120 may apply solder paste to the substrate 142 on which the stencil mask is disposed. At least one pad may exist on the substrate 142. The solder paste applied by the screen printer 120 may be disposed on at least one pad.

The solder inspection device 130 may receive a substrate 144 to which solder paste is applied. The solder inspection device 130 may measure the state of the solder paste applied to the substrate 144. As described above, solder paste may be applied to a region that is offset a predetermined extent from a pad on the substrate due to the disposition error of the stencil mask or the like. Hereinafter, the term "substrate", used without a reference numeral, may indicate the substrate 142 before solder paste is applied or the substrate 144 after solder paste is applied, or may indicate both.

The apparatus 100 according to the present disclosure may obtain first information associated with each of the at least one pad on the substrate. The first information may include information associated with the size, the shape, and the location of the region that each pad occupies on the substrate. Also, the apparatus 100 may obtain second information associated with each piece of the solder paste applied to each of the at least one pad on the substrate. The second information may include information associated with the size, the shape, and the location of a region that each piece of applied solder paste occupies on the substrate. The second information may be obtained from the solder inspection device 130.

The apparatus 100 may determine a position correction value for the stencil mask with respect to the substrate using the obtained first information and/or second information. The position correction value may be determined according to various methods. The process of determining the position correction value will be described later.

The apparatus 100 may deliver the determined position correction value to the screen printer 120. Using the delivered position correction value, the position of the stencil mask with respect to the substrate may be corrected. According to an embodiment, the screen printer 120 may adjust parameters such as a solder-printing pressure and/or solder-printing speed, or the like based on the position correction value. According to an embodiment, the apparatus 100 may deliver the position correction value to another component (device) in the substrate-manufacturing process, other than the screen printer 120. In this case, each parameter related to the substrate-manufacturing process may be corrected based on the delivered position correction value.

Figure 2:
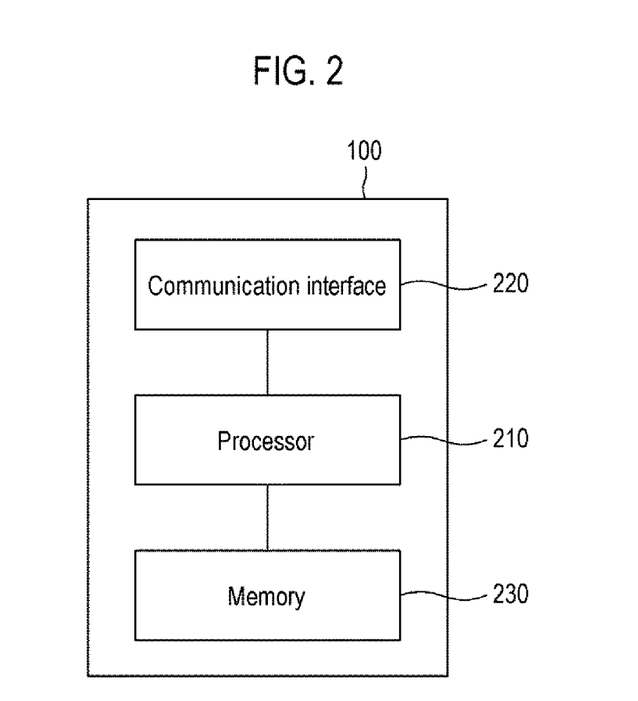
FIG. 2 is a block diagram of an apparatus 100 according to various embodiments of the present disclosure.

FIG. 2 is a block diagram of an apparatus 100 according to various embodiments of the present disclosure. According to an embodiment, the apparatus 100 may include a processor 210, a communication interface 220, and/or a memory 230. According to an embodiment, at least one of the elements of the apparatus 100 may be omitted, or other elements may be added to the apparatus 100. Additionally or alternatively, some of the elements may be implemented so as to be integrated, or may be implemented as a single entity or a plurality of entities. At least some of the elements disposed inside or outside the apparatus 100 may be connected via a bus, a general-purpose input/output (GPIO) interface, a serial peripheral interface (SPI), or a mobile industry processor interface (MIPI), or the like, and may exchange data and/or signals one another.

The communication interface 220 may communicate with the screen printer 120 and/or the solder inspection device 130. The communication interface 220 may obtain second information from the solder inspection device 130 or deliver the determined position correction value to the screen printer 120. The communication interface 220 may perform wireless or wired communication between the apparatus 100 and a server or between the apparatus 100 and other external apparatuses. For example, the communication interface 220 may perform wireless communication based on long-term evolution (LTE), LTE Advanced (LTE-A), code division multiple access (CDMA), wideband CDMA (WCDMA), wireless broadband (WiBro), Wi-Fi, Bluetooth, nearfield communication (NFC), a global positioning system (GPS) or global navigation satellite system (GNSS), or the like. For example, the communication interface 220 may perform wired communication based on a universal serial bus (USB), a high-definition multimedia interface (HDMI), recommended standard 232 (RS-232), a plain old telephone service (POTS), or the like.

The processor 210 may control at least one element of the apparatus 100 connected to the processor 210 by driving software (e.g., a program). Also, the processor 210 may be implemented as a microprocessor, a central processing unit (CPU), or the like, which is suitable for performing various operations, processing, data generation, or manufacturing related to the present disclosure. Also, the processor 210 may load data or the like from the memory 230, or may store data or the like in the memory 230. The processor 210 may obtain the first information from the memory 230. The processor 210 may control the communication interface 220, and may obtain the second information from the solder inspection device 130. The processor 210 may determine the position correction value for a stencil mask with respect to a substrate based on the first information and/or second information. The processor 210 may control the communication interface 220 to deliver the position correction value to the screen printer 120.

The memory 230 may store various data. The data stored in the memory 230 may be data obtained, processed, or used by at least one element of the apparatus 100, and may include software (e.g., a program). The memory 230 may include transitory and/or non-transitory memory. The memory 230 may store the first information and/or second information. In the present disclosure, a program may be software stored in the memory 230, and may include an operating system for controlling resources of the apparatus 100, applications, and/or middleware that provide various functions to the applications such that the applications utilize the resources of the apparatus 100.

According to an embodiment, the processor 210 may obtain information from a server by controlling the communication interface 220. The information obtained from the server may be stored in the memory 230. According to an embodiment, the information obtained from the server may include the above-described first information and/or second information or the like.

According to an embodiment, the apparatus 100 may further include an input device (not illustrated). The input device may be a device that receives, from the outside, input of data which is to be delivered to at least one element of the apparatus 100. For example, the input device may include a mouse, a keyboard, a touch pad, or the like.

According to an embodiment, the apparatus 100 may further include an output device (not illustrated). The output device may be a device to provide various data, such as an inspection result, an operation state, and the like associated with the apparatus 100, to a user in a visual form. For example, the output device may include a display, a projector, a hologram, or the like.

According to an embodiment, the apparatus 100 may be provided in one of the various types of devices. For example, the apparatus 100 may be a portable communication device, a computer device, a portable multimedia device, or a wearable device, or may be a combination of one or more of the above-described devices. The apparatus 100 of the present disclosure is not limited to the above-described devices.

Various embodiments of the apparatus 100 according to the present disclosure may be applied in combination. Combinations of embodiments may be devised based on the number of cases that may occur, and the embodiments of the apparatus 100 resulting from such combination may also be included in the scope of the present disclosure. Also, the elements disposed inside or outside the apparatus 100 according to the above-described present disclosure may be added, modified, replaced, or removed depending on the embodiment. Also, the elements disposed inside or outside the apparatus 100 may be implemented as hardware components.

Figure 3:
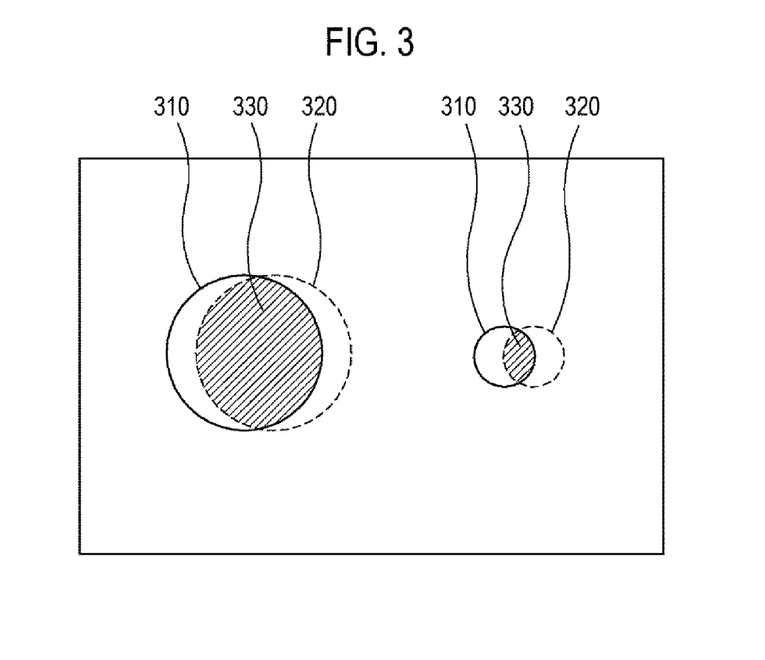
FIG. 3 illustrates a process of determining a position correction value according to an embodiment of the present disclosure.

FIG. 3 illustrates a process of determining a position correction value according to an embodiment of the present disclosure. In order to determine a position correction value, a position offset value between a pad and solder paste applied to the pad may be calculated. The mean value of position offset values calculated for every pad may be determined to be the final position correction value, and the position correction value may be delivered to the screen printer. In this instance, pads on the substrate may have different sizes and shapes. Therefore, if the position of a stencil mask is corrected by simply applying a position correction value obtained based on the mean value of offsets, the position offset of solder paste with respect to a predetermined pad may even increase. Particularly, in the case of a small pad, if a position correction value calculated based on a mean value as described above is applied, solder paste may be applied to a location that is even more distant from the pad than before the compensation is performed.

As shown in the embodiment, the apparatus 100 according to the present disclosure may determine a position correction value that maximizes a cross area (i.e., a common area) in which the entire regions occupied by pads of the substrate and the entire regions occupied by applied solder overlap each other.

Specifically, the processor 210 may determine a plurality of first regions 310, respectively occupied by a plurality of pads on the substrate, based on the first information. A single pad on the substrate may occupy a predetermined region (e.g., a first region) on the substrate, depending on the size and the shape of the corresponding pad. The processor 210 may determine a first region occupied by each pad on the substrate. The position information of a first region on the substrate may be indicated by x and y coordinates of the center point of a corresponding pad with respect to the substrate.

Also, the processor 210 may determine a plurality of second regions 320 respectively occupied by solder paste applied to the plurality of pads based on the second information. As described above, solder paste may be applied to each pad on the substrate. A piece of the solder paste applied to a single pad may occupy a predetermined region (e.g., a second region) on the substrate depending on the size and the shape of the corresponding pad. The regions occupied by the applied solder paste may be measured by the solder inspection device 130, and information associated with the regions of the applied solder paste may be included in the second information. Based on the second information, the processor 210 may determine a second region occupied by each piece of the solder paste on the substrate. The position information of a second region on the substrate may be indicated by the x and y coordinates of the center point of solder paste with respect to the substrate.

The processor 210 may determine, for each pad, a cross region 330 where the first region of a pad and the second region of solder paste applied to the pad overlap each other. The cross region may be a region corresponding to the intersection of a first region and a second region. The processor 210 may determine a plurality of cross regions 330 for each of the plurality of pads on the substrate.

The processor 210 may determine a first cross area ratio of the entire area of the plurality of determined cross regions 330 to the entire area of the plurality of first regions 310 of the pads. The processor 210 may determine a position correction value based on the first cross area ratio. According to an embodiment, the processor 210 may determine a position correction value for the stencil mask that maximizes the first cross area ratio. The determined position correction value may be delivered to the screen printer 120.

The position correction value that maximizes the ratio of the cross area, where the entire regions occupied by pads of the substrate and the entire regions occupied by applied solder paste overlap each other, may be determined according to the equation given below.

$$\underset{\vec{x} \in S}{\mathrm{argmax}} \sum_{i=1}^{N} f_i(\vec{O_i} - \vec{x}) \qquad \text{[Equation 1]}$$

x denotes a vector indicating the position of a corresponding pad. S may have a range of [−a, a]×[−a, a] (where a is the length of one side of a substrate). According to an embodiment, when the width and the length of the substrate are a and b, S may have a range of [−a, a]×[−b, b]. $O_i$ denotes a predictive offset vector of an i-th pad. That is, this is a vector showing the extent to which applied solder paste is offset from the i-th pad. $f_i$ denotes the ratio of a cross area where the first region of an i-th pad and the second region of solder paste applied to the corresponding pad overlap each other, and the cross area ratio is expressed as a percentage. N denotes the number of pads on the substrate or the number of openings formed in the stencil mask.

Figure 4:
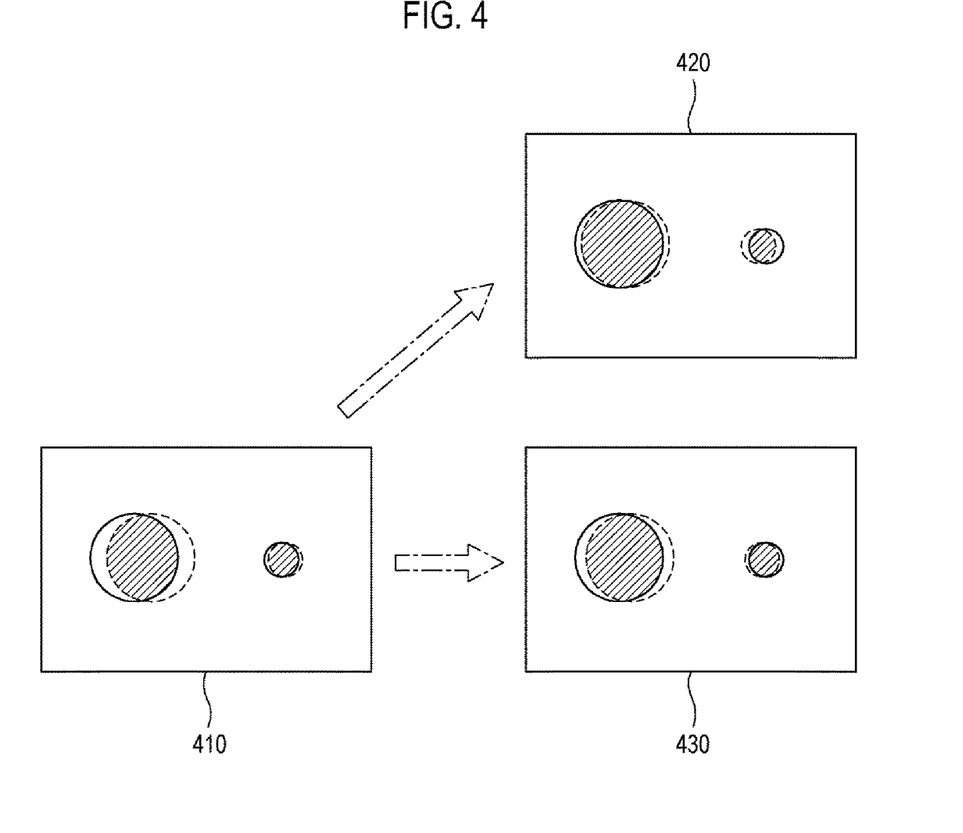
FIG. 4 illustrates an example of applying a position correction value according to an embodiment of the present disclosure.

FIG. 4 illustrates an example of applying a position correction value according to an embodiment of the present disclosure. In the present example, solder paste may be applied to a substrate 410. The left pad on the substrate 410 may be a circle with a radius of 5, and the right pad on the substrate may be a circle with a radius of 2. The processor 210 of the apparatus 100 may determine an offset value for each pad of the substrate 410, that is, the extent to which solder paste applied to each pad is offset from a corresponding pad. In the present example, the offset value of the left pad may be (1, 0), and the offset value of the right pad may be (0.2, 0).

According to an embodiment that determines the mean value of offset values as a position correction value, the position correction value may be determined to be (0.6, 0), which is the mean value of (1, 0) and (0.2, 0). When the corresponding position correction value is applied, the position of a stencil mask on the substrate may be adjusted by (0.6, 0). The illustrated substrate 420 may show the state of application of solder paste after the position correction value based on the mean value is applied. Solder paste applied to the right pad, which has a relatively small radius, is offset from the pad even more than before the compensation value is applied.

In contrast, as described with reference to FIG. 3, according to an embodiment that uses a position correction value that maximizes the ratio of a cross area, where the entire regions of the pads and the entire regions of solder paste overlap each other, solder paste may be applied as illustrated in the substrate 430. The solder paste is applied such that the area where the pads and solder paste overlap is increased to the maximum, whereby the error rate when components are mounted may be reduced.

Figure 5:
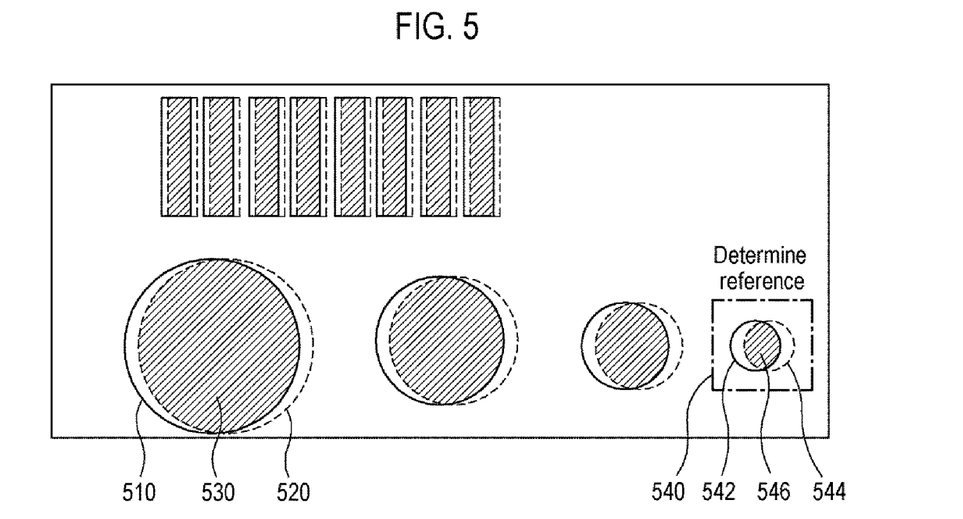
FIG. 5 illustrates a process of determining a position correction value according to another embodiment of the present disclosure.

FIG. 5 illustrates a process of determining a position correction value according to another embodiment of the present disclosure. According to an embodiment, the apparatus 100 may determine a position correction value based on the pad having the smallest cross area ratio.

As described above, the processor 210 may determine, for each pad, a region (e.g., 530, 546, and the like) where a first region (e.g., 510, 542, or the like) of a pad and a second region (e.g., 520, 544, or the like) of solder paste applied to the pad overlap. The processor 210 may determine a second cross area ratio of a single determined cross region 530, 546, or the like to the first region 510, 542, or the like of a corresponding pad, for each of the at least one pad on the substrate. The second cross area ratio is a value determined for each pad, and may denote the ratio of the cross region (e.g., the cross region 546) of a pad to the first region (e.g., the region 542) of the corresponding pad. The second cross area ratio may be different from the first cross area ratio which denotes the ratio of the entire area of the plurality of cross regions (e.g., the sum of the regions 530, 546, and the like) to the entire area of the first regions of the plurality of pads (e.g., the sum of the regions 510, 542, and the like).

The processor 210 may determine the pad 540 that has the smallest second cross area ratio among the at least one pad of the substrate. The processor 210 may determine a position correction value based on the pad 540 that is determined to be the pad having the smallest second cross area ratio. According to an embodiment, the processor 210 may determine a position correction value for a stencil mask that maximizes the second cross area ratio of the determined pad 540. In this instance, second cross area ratios of the other pads excluding the second cross area ratio of the determined pad 540 may not be considered in the process of determination of the position correction value. The determined position correction value may be delivered to the screen printer 120.

A position correction value that maximizes the cross area ratio of the pad having the smallest cross area ratio may be determined according to the equation given below. Each parameter has been described in the above description.

$$\operatorname*{argmaxmin}_{\vec{x} \in S}(\{f_i(\vec{O_i} - \vec{x}) \mid i \in [1, \ldots N]\}) \quad \text{[Equation 2]}$$

Figure 6:
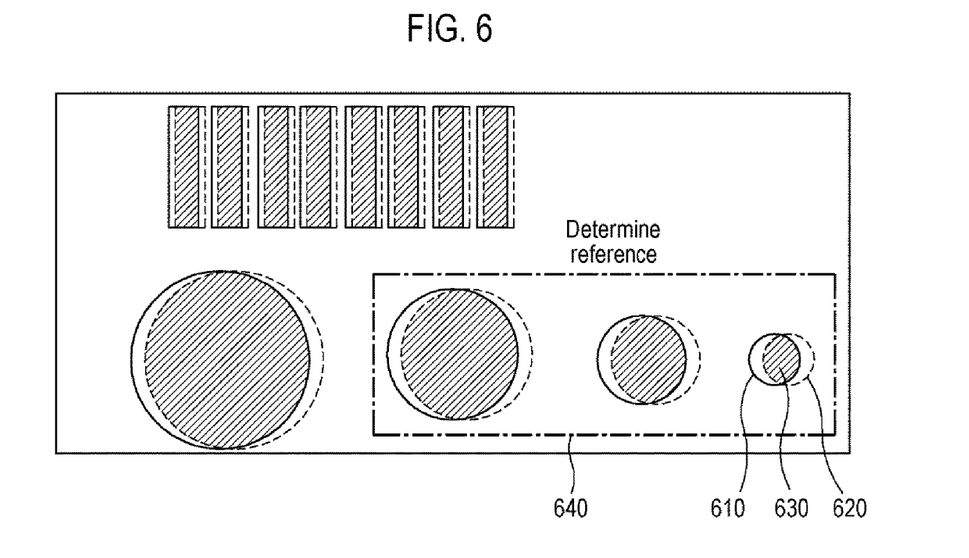
FIG. 6 illustrates a process of determining a position correction value according to another embodiment of the present disclosure.

FIG. 6 illustrates a process of determining a position correction value according to another embodiment of the present disclosure. According to an embodiment, the apparatus 100 may determine a position correction value based on pads that have second cross area ratios that are smaller than a reference ratio.

As described above, the processor 210 may determine a second cross area ratio for each pad on the substrate. Based on the second cross area ratio determined for each pad, at least one pad may be selected. According to an embodiment, the processor 210 may determine one or more pads 640 having second cross area ratios that are smaller than a predetermined reference ratio, among the plurality of pads. The processor 210 may determine a position correction value for a stencil mask that maximizes the second cross area ratios of the determined one or more pads 640. In this instance, the second cross area ratios of the other pads excluding the second cross area ratios of the determined pads 640 may not be considered in the process of determination of the position correction value. The determined position correction value may be delivered to the screen printer 120.

According to an embodiment, the processor 210 may determine a cross area ratio of the entire area of cross regions (e.g., cross region 630 and the like) of the determined pads 640 to the entire area of the first regions (e.g., the regions 610 and the like) of the determined pads 640. The processor 210 may determine a position correction value based on the cross area ratio. The processor 210 may determine a position correction value that maximizes the cross area ratio.

According to an embodiment, the apparatus 100 may determine a position correction value based on the absolute size of a region (e.g., a first region) occupied by a pad, instead of a cross area ratio. This is because the error of dislocation of applied solder paste may affect a second cross area ratio more significantly as the size of a pad is smaller. The processor 210 may determine one or more pads having first regions that are smaller than a predetermined reference size, among at least one pad, based on the first information. The processor 210 may determine a position correction value for the stencil mask that maximizes the second cross area ratios of the determined one or more pads. In this instance, the second cross area ratios of the other pads excluding the second cross area ratios of the determined pads may not be considered in the process of determination of the position correction value.

According to an embodiment, the apparatus 100 may determine a position correction value by applying a weight to parameters (e.g., a second cross area ratio) of pads determined according to the above-described criteria. As described above, a position correction value may be determined based on only the pads determined according to predetermined criteria. However, a position correction value may be determined by taking into consideration all pads according to an embodiment, and by applying a weight to an amount of change in parameters of the determined one or more pads. According to an embodiment, the processor 210 may determine a position correction value by applying a weight to an amount of change of the second cross area ratios of the determined one or more pads, the second cross area ratios changing as the position of the stencil mask is corrected. In this instance, the second cross area ratios of the other pads may also be considered in the process of determination of the position correction value. For example, if the second cross area ratios increase by the same amount, a position correction value may be determined in a way that increases the second cross area ratios of the determined one or more pads, rather than a way that increases the second cross area ratios of the other pads.

According to an embodiment, the apparatus 100 may determine a position correction value based on a combination of the first cross area ratio and the second cross area ratios of the determined one or more pads. For example, the apparatus 100 may determine a position correction value in a way that increases the second cross area ratios of the determined one or more pads, and may prevent the first cross area ratio from being smaller than a predetermined low limit, due to the determined position correction value.

Figure 7:
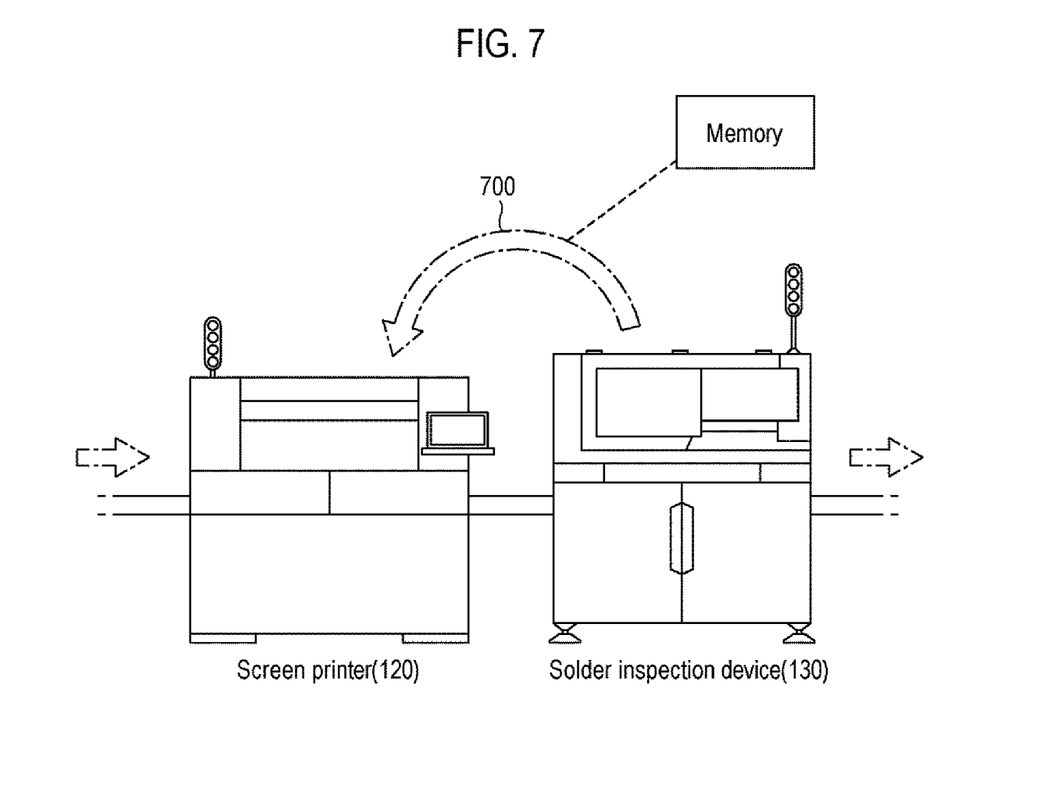
FIG. 7 illustrates a process of processing position correction values as a position correction value is determined repeatedly a number of times, according to an embodiment of the present disclosure.

FIG. 7 illustrates a process of processing position correction values as a position correction value is determined repeatedly a number of times, according to an embodiment of the present disclosure. According to an embodiment, the apparatus 100 may determine a position correction value a number of times, and deliver the mean value of the determined position correction values to the screen printer 120 as illustrated in arrow 700.

Specifically, the processor 210 may determine a position correction value repeatedly a number of times. The processor 210 may determine position correction values according to at least one of the above-described embodiments. The processor 210 may determine at least one selected from the mean value, the median value and the mode value of the plurality of determined position correction values. The determined position correction values may be stored in the memory 230 or the like. In the present disclosure, the mean value may be a value obtained by adding the values of all samples and dividing the sum by the number of the samples. In the present disclosure, the median value may indicate a value in the middle of the values of all samples. When the values of the samples are arranged in ascending order, and the number of the samples is an odd number, the middle one is determined to be the median value. When the number of the samples is an even number, the mean value of the two values in the middle is determined to be the median value. In the present disclosure, the mode value indicates the value that most frequently appears from among the values of samples. The processor 210 may control the communication interface 220 so as to deliver a determined mean value or the like to the screen printer 120.

The final position correction value determined based on the mean value or the like of accumulated position correction values may be determined according to above-described Equation 1 and Equation 2. In this instance, $O_i$ in Equations 1 and 2 may be defined as below. The other parameters have been described in the above description.

$$O_{ti}: E_{ti} - P_t \quad \text{[Equation 3]}$$

$$O_i: \sum_{t=1}^{T} \frac{O_{ti}}{T}$$

$E_{ti}$ may be a t-th determined predictive offset vector for an i-th pad. T denotes the total number of times that a position correction value is determined. $P_t$ denotes the mean value of $E_{ti}$ of all pads.

According to an embodiment, the apparatus 100 may determine a printing-related parameter of the screen printer 120 based on a determined position correction value or the like, and deliver the printing-related parameter to the screen printer 120. The processor 210 may determine a correction value for the solder-printing pressure of the screen printer 120, a correction value of the solder-printing speed of the screen printer 120, or the like, based on first information, second information, and/or a determined position correction value. The processor 210 may control the communication interface 220 so as to deliver the determined solder-printing pressure correction value and/or the solder-printing speed correction value to the screen printer 120.

According to an embodiment, a position correction value may include a position correction value for an x-axial direction, and a position correction value for a y-axial direction for a stencil mask with respect to a substrate. A position correction value may further include the amount of rotation for the stencil mask with respect to the substrate. The x-axis and the y-axis may correspond to the width and the length of the substrate, respectively, and may be perpendicular to each other. The stencil mask may move in the x- and y-axial directions on the substrate according to the position correction values for the x- and y-axial directions. The amount of rotation may be a value that is used to perform correction associated with the angle at which the stencil mask is inclined with respect to the substrate. The stencil mask may rotate with respect to the substrate by the amount of rotation, whereby the stencil mask may be rearranged to fit the substrate.

According to an embodiment, the screen printer 120 may apply only a predetermined percentage of a position correction value that is received from the apparatus 100 according to the present disclosure. Also, according to an embodiment, the screen printer 120 may store a position correction value received from the apparatus 100 according to the present disclosure, and perform position correction using the mean value of the stored position correction values.

Figure 8:
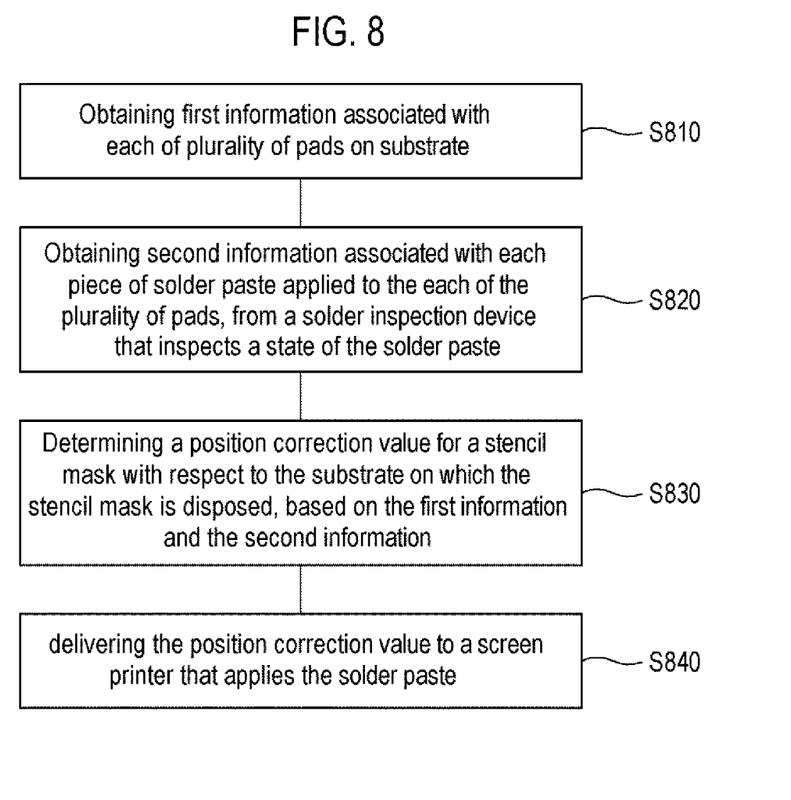
FIG. 8 illustrates an embodiment of a method of performing compensation associated with a screen printer, which is performed by the apparatus 100 according to the present disclosure.

FIG. 8 illustrates an embodiment of a method of performing compensation associated with a screen printer, which is performed by the apparatus 100 according to the present disclosure. Although the flowchart may seem to describe that the operations of a method and an algorithm according to the present disclosure are performed sequentially, the operations may be performed in a different order that is arbitrarily determined based on the present disclosure, in addition to being performed in the sequential order. The descriptions associated with the flowchart do not exclude modification or correction of the method or the algorithm, and do not indicate that a predetermined operation is essential or preferable. According to an embodiment, at least some operations may be performed in parallel, repetitively, or heuristically. According to an embodiment, at least some operations may be omitted, or other operations may be added.

The apparatus 100 according to the present disclosure may perform a method of performing compensation associated with a screen printer according to various embodiments of the present disclosure. The method according to an embodiment of the present disclosure may include: obtaining first information associated with each of a plurality of pads on a substrate S810; obtaining second information associated with each piece of solder paste applied to each of the plurality of pads, from a solder inspection device that measures the state of solder paste S820; determining a position correction value for a stencil mask with respect to the substrate on which the stencil mask is disposed, based on the first information and/or the second information S830; and/or delivering the position correction value to a screen printer that applies the solder paste S840.

In S810, the processor 210 of the apparatus 100 may obtain the first information associated with each of the plurality of pads on the substrate. In S820, the processor 210 may obtain the second information associated with each piece of solder paste applied to each of the plurality of pads, from the solder inspection device that measures the state of the solder paste. In S830, the processor 210 may determine a position correction value for the stencil mask with respect to the substrate on which the stencil mask is disposed based on the first information and/or second information. In S840, the processor 210 may deliver the position correction value to the screen printer that applies solder paste.

According to an embodiment, step S830 that determines the position correction value may include: determining, by the processor 210, a plurality of first regions on the substrate based on the first information, and each of the plurality of first regions corresponds to each of the plurality of pads; determining a plurality of second regions on the substrate based on the second information, and each of the plurality of second regions corresponds to each piece of the solder paste applied to each of the plurality of pads; determining a plurality of cross regions in which the plurality of first regions and the plurality of second regions overlap each other; determining a first cross area ratio of the entire area of the plurality of cross regions to the entire area of the plurality of first regions; and/or determining a position correction value that maximizes the first cross area ratio.

According to an embodiment, step S830 that determines the position correction value may include: determining, by the processor 210, a second cross area ratio for each of the plurality of pads, and the second cross area ratio may be a ratio of an area of one of the plurality of cross regions to an area of one of the plurality of first regions; determining a pad that has the smallest second cross area ratio among the plurality of pads; and/or determining the position correction value that maximizes the second cross area ratio of the determined pad.

According to an embodiment, step S830 that determines the position correction value may include: determining, by the processor 210, one or more pads having second cross area ratios that are smaller than a predetermined reference ratio, among the plurality of pads; and/or determining a position correction value that maximizes the second cross area ratios of the determined one or more pads.

According to an embodiment, step S830 that determines the position correction value may include: determining, by the processor 210, a position correction value by applying a weight to an amount of change of the second cross area ratios of the determined one or more pads which changes as a position of the stencil mask is corrected.

According to an embodiment, the method of performing compensation associated with the screen printer may include: repeatedly determining, by the processor 210, a position correction value a number of times; and/or delivering, to the screen printer, at least one selected from a mean value, a median value and a mode value of a plurality of determined position correction values.

According to an embodiment, the method of performing compensation associated with the screen printer may include: determining, by the processor 210, a solder-printing pressure correction value and a solder-printing speed correction value for the screen printer based on the first information, the second information and the position correction value; and/or delivering the solder-printing pressure correction value and the solder-printing speed correction value to the screen printer.

According to an embodiment, the position correction value may include a position correction value for a direction of a first axis, a position correction value for a direction of a second axis, and/or an amount of rotation for the stencil mask with respect to the substrate, the second axis being perpendicular to the first axis. Here, the first axis and the second axis may respectively correspond to the above-described x-axis and y-axis.

Various embodiments of the present disclosure may be implemented as software in a machine-readable storage medium. The software may be software for implementing various embodiments of the present disclosure. The software may be inferred from various embodiments of the present disclosure by programmers in the field of the art to which the present disclosure belongs. For example, software may be a program including commands (e.g., code or code segments) that are readable by the machine. The machine may be a device such as a computer, which is operable according to commands retrieved from a storage medium. According to an embodiment, the machine may be the apparatus 100 according to embodiments of the present disclosure. According to an embodiment, a processor of the machine may execute retrieved commands, such that the elements of the device perform functions corresponding to the commands. According to an embodiment, the processor may be the processor 210 according to embodiments of the present disclosure. The storage medium may indicate all types of recording media storing data which are readable by a device. The storage medium may include, for example, ROM, RAM, a CD-ROM, magnetic tape, a floppy disk, an optical data storage device, or the like. According to an embodiment, the storage medium may be the memory 230. According to an embodiment, the storage medium may be implemented to be distributed in computer systems or the like connected via a network. Software may be distributed to computer systems so as to be stored and implemented therein. The storage medium may be a nonvolatile storage medium. The non-transitory storage medium is a tangible medium that exists irrespectively of semi-permanent or temporary storage of data, and does not include a signal that is propagated in a transient manner.

Although the technical idea of the present disclosure has been described with reference to various embodiments, the technical idea of the present disclosure may include various replacements, modifications, and changes made within the scope that those skilled in the art can understand. Also, it should be understood that such replacements, modifications, and changes are included in the claims attached hereto.

What is claimed is:

1. An apparatus that communicates with a screen printer, which applies solder paste to a substrate on which a stencil mask is disposed, and communicates with a solder inspection device, which measures a state of the solder paste applied to the substrate, the apparatus comprising, a processor configured to:

obtain first information associated with each of a plurality of pads on the substrate;

obtain second information associated with each piece of the solder paste applied to each of the plurality of pads from the solder inspection device;

determine a plurality of first regions on the substrate based on the first information, each of the plurality of first regions corresponding to each of the plurality of pads;

determine a plurality of second regions on the substrate based on the second information, each of the plurality of second regions corresponding to each piece of the solder paste applied to each of the plurality of pads;

determine a plurality of cross regions in which the plurality of first regions and the plurality of second regions overlap each other;

determine a second cross area ratio for each of the plurality of pads, the second cross area ratio being a ratio of an area of one of the plurality of cross regions to an area of one of the plurality of first regions;

determine a pad that has the smallest second cross area ratio among the plurality of pads;

determine a position correction value that maximizes the second cross area ratio of the determined pad, and deliver the position correction value to the screen printer.

2. The apparatus of claim 1, wherein the processor is further configured to:

determine one or more pads having second cross area ratios that are smaller than a predetermined reference ratio among the plurality of pads; and determine the position correction value that maximizes the second cross area ratios of the determined one or more pads.

3. The apparatus of claim 2, wherein the processor is further configured to:

determine the position correction value by applying a weight to an amount of change of the second cross area ratios of the determined one or more pads which changes as a position of the stencil mask is corrected.

4. The apparatus of claim 1, wherein the processor is further configured to:

determine one or more pads having first regions that are smaller than a predetermined reference size among the plurality of pads, based on the first information; and determine the position correction value that maximizes the second cross area ratios of the determined one or more pads.

5. A method performed by an apparatus, the method comprising:

obtaining first information associated with each of a plurality of pads on a substrate;

obtaining second information associated with each piece of solder paste applied to each of the plurality of pads, from a solder inspection device that measures a state of the solder paste;

determining a plurality of first regions on the substrate based on the first information, each of the plurality of first regions corresponding to each of the plurality of pads;

determining a plurality of second regions on the substrate based on the second information, each of the plurality of second regions corresponding to each piece of the solder paste applied to each of the plurality of pads;

determining a plurality of cross regions in which the plurality of first regions and the plurality of second regions overlap each other;

determining a second cross area ratio for each of the plurality of pads, the second cross area ratio being a ratio of an area of one of the plurality of cross regions to an area of one of the plurality of first regions;

determining a pad that has the smallest second cross area ratio among the plurality of pads;

determining a position correction value that maximizes the second cross area ratio of the determined pad; and delivering the position correction value to a screen printer that applies the solder paste.

6. The method of claim 5, wherein the determining the position correction value further includes:

determining one or more pads having second cross area ratios that are smaller than a predetermined reference ratio among the plurality of pads; and determining the position correction value that maximizes the second cross area ratios of the determined one or more pads.

7. The method of claim 6, wherein the determining the position correction value further includes:

determining the position correction value by applying a weight to an amount of change of the second cross area ratios of the determined one or more pads which changes as a position of a stencil mask is corrected.

8. The method of claim 5, wherein the determining the position correction value further includes:

determining one or more pads having first regions that are smaller than a predetermined reference size among the plurality of pads, based on the first information; and determining the position correction value that maximizes the second cross area ratios of the determined one or more pads.

9. A non-transitory computer-readable recording medium storing a program to be executed on a computer, wherein the program includes commands that, when executed by a processor, causes the processor to perform:

obtaining first information associated with each of a plurality of pads on a substrate;

obtaining second information associated with each piece of solder paste applied to each of the plurality of pads, from a solder inspection device that measures a state of the solder paste;

determining a plurality of first regions on the substrate based on the first information, each of the plurality of first regions corresponding to each of the plurality of pads;

determining a plurality of second regions on the substrate based on the second information, each of the plurality of second regions corresponding to each piece of the solder paste applied to each of the plurality of pads;

determining a plurality of cross regions in which the plurality of first regions and the plurality of second regions overlap each other;

determining a second cross area ratio for each of the plurality of pads, the second cross area ratio being a ratio of an area of one of the plurality of cross regions to an area of one of the plurality of first regions;

determining a pad that has the smallest second cross area ratio among the plurality of pads;

determining a position correction value that maximizes the second cross area ratio of the determined pad; and delivering the position correction value to a screen printer that applies the solder paste.

\* \* \* \* \*